(12) United States Patent
Ise et al.

(10) Patent No.: US 7,348,070 B2
(45) Date of Patent: Mar. 25, 2008

(54) ORGANIC ELECTROLUMINESCENT DEVICE

(75) Inventors: Toshihiro Ise, Kanagawa (JP); Tatsuya Igarashi, Kanagawa (JP)

(73) Assignee: Fujifilm Corporation, Tokyo (JP)

(*) Notice: Subject to any disclaimer, the term of this patent is extended or adjusted under 35 U.S.C. 154(b) by 238 days.

(21) Appl. No.: 10/745,675

(22) Filed: Dec. 29, 2003

(65) Prior Publication Data

US 2004/0166365 A1 Aug. 26, 2004

(30) Foreign Application Priority Data

Dec. 27, 2002 (JP) .......................... P.2002-382455

(51) Int. Cl.
*H01L 51/54* (2006.01)
(52) U.S. Cl. ...................... 428/690; 428/917; 313/504; 257/40; 257/E51.043; 257/E51.044
(58) Field of Classification Search ...................... None
See application file for complete search history.

(56) References Cited

U.S. PATENT DOCUMENTS

| | | | | |
|---|---|---|---|---|
| 6,420,057 B1 * | 7/2002 | Ueda et al. | ................. | 428/690 |
| 6,790,540 B2 * | 9/2004 | Mori et al. | ................. | 428/690 |
| 2001/0019782 A1 * | 9/2001 | Igarashi et al. | ............. | 428/690 |
| 2002/0125818 A1 * | 9/2002 | Sato et al. | ................. | 313/504 |
| 2003/0218418 A9 * | 11/2003 | Sato et al. | ................. | 313/504 |
| 2004/0124769 A1 * | 7/2004 | Ise et al. | .................... | 313/504 |

FOREIGN PATENT DOCUMENTS

| | | |
|---|---|---|
| JP | 2002-305083 A | 10/2002 |
| WO | WO 01/93642 A1 * | 12/2001 |

* cited by examiner

*Primary Examiner*—Marie Yamnitzky
(74) *Attorney, Agent, or Firm*—Sughrue Mion, PLLC

(57) ABSTRACT

An organic electroluminescent device comprising: a pair of electrodes; and at least one organic compound layer between the pair of electrodes, the at least one organic compound layer including a light emitting layer, wherein the light emitting layer contains a phosphorescent material and a compound represented by the formula (I) as defined herein.

16 Claims, No Drawings

ORGANIC ELECTROLUMINESCENT DEVICE

FIELD OF THE INVENTION

This invention relates to an organic electroluminescent device (hereinafter abbreviated as "OLED"), particularly an OLED having a high luminance, a high luminescence efficiency, and excellent durability.

BACKGROUND OF THE INVENTION

OLEDs have been actively studied and developed because of their capabilities of emitting light of high brightness at a low driving voltage. An OLED generally comprises a pair of opposing electrodes having therebetween a light emitting layer or a plurality of organic layers including a light emitting layer. With an electric field applied to the opposing electrodes, electrons and holes are injected from the cathode and the anode, respectively, into the light emitting layer, where they are recombined to form excitons, which emit light. Otherwise, energy is transferred from the excitons to create excitons of other molecules, which emit light.

JP-A-2002-305083 discloses an organic phosphorescent electroluminescent device of which the light emitting layer contains an organic metal complex containing at least one metal selected from the groups 7 to 11 of the Periodic Table and an organic metal complex represented by the formula (I) shown in JP-A-2002-305083. The publication specifically recites a laminate structure having an electron transporting layer comprising tris (8-hydroxyquinoline) aluminum complex (Alq) as an electron transporting material and a hole blocking layer comprising an aluminum complex (designated HB-12) provided between the light emitting layer and the electron transporting layer. Therefore, the device disclosed is still insufficient in luminescence efficiency and durability. Development of an OLED with higher luminance, higher luminescence efficiency, and improved durability has been keenly awaited.

SUMMARY OF THE INVENTION

An object of the present invention is to provide an OLED containing a phosphorescent material in its light emitting layer in combination with a specific compound to exhibit high luminance, high luminescence efficiency, and satisfactory durability.

The object of the invention is accomplished by an OLED comprising a pair of electrodes and at least one organic compound layer including a light emitting layer provided in between the electrodes, wherein the light emitting layer contains a phosphorescent material and a compound represented by formula (I):

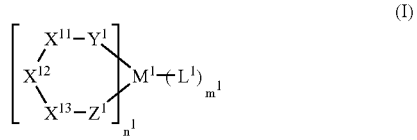

wherein $X^{11}$, $X^{12}$, and $X^{13}$ each represent a carbon atom, a nitrogen atom, an oxygen atom or a sulfur atom; $Y^1$ represents a carbon atom, a nitrogen atom, an oxygen atom, a sulfur atom or a phosphorus atom; $Z^1$ represents a nitrogen atom, an oxygen atom, a sulfur atom or a phosphorus atom; $M^1$ represents a metal ion; $L^1$ represents a ligand; $n^1$ represents an integer of 1 or greater; $m^1$ represents an integer of 0 or greater; and the bonds between every adjacent atoms is selected from a single bond, a double bond, a triple bond, and a coordinate bond; with proviso that a compound in which either one of $Y^1$ and $Z^1$ is a nitrogen atom and the other is an oxygen atom is excluded.

The present invention provides the following embodiments of the above-described OLED:

1) The light emitting layer contains the compound of formula (I) as a host material.
2) The light emitting layer contains the compound of formula (I) as a main component, and the phosphorescent material substantially emits light.
3) The compound of formula (I) is a compound represented by formula (II):

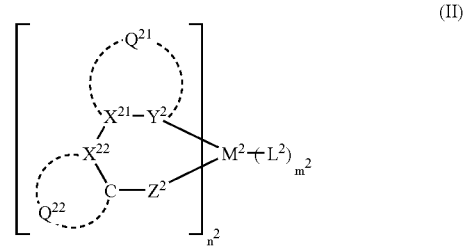

wherein $X^{21}$ and $X^{22}$ each represent a carbon atom or a nitrogen atom; $Y^2$ represents a carbon atom, a nitrogen atom, an oxygen atom, a sulfur atom or a phosphorus atom; $Z^2$ represents a nitrogen atom, an oxygen atom, a sulfur atom or a phosphorus atom; $Q^{21}$ represents an atomic group (group of atoms) necessary to form a 5- to 7-membered ring; $Q^{22}$ represents an atomic group necessary to form a 5- to 7-membered ring; $M^2$ represents a metal ion; $L^2$ represents a ligand; $n^2$ represents an integer of 1 or greater; $m^2$ represents an integer of 0 or greater; and the bond between every adjacent atoms is selected from a single bond, a double bond, a triple bond, and a coordinate bond; with proviso that a compound in which either one of $Y^2$ and $Z^2$ is a nitrogen atom and the other is an oxygen atom is excluded.

4) The compound of formula (I) is a compound represented by formula (III):

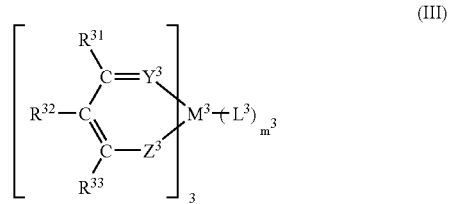

wherein $R^{31}$, $R^{32}$, and $R^{33}$ each represent a hydrogen atom or a substituent; $Y^3$ represents a carbon atoms, a nitrogen atom, an oxygen atom, a sulfur atom or a phosphorus atom; $Z^3$ represents a nitrogen atom, an oxygen atom, a sulfur atom or a phosphorus atom; $M^3$ represents a metal ion; $L^3$ represents a ligand; $n^3$ represents an integer of 1 or greater; $m^3$ represents an integer of 0 or greater; the bond between $Y^3$ and $M^3$ and the bond between $Z^3$ and $M^3$ is a covalent bond or a coordinate bond; with the proviso that a compound in which either one of $Y^3$ and $Z^3$ is a nitrogen atom and the other is an oxygen atom is excluded.

5) The light emitting layer contains at least two host materials.

DETAILED DESCRIPTION OF THE INVENTION

The OLED of the present invention is a device having at least one organic compound layer (also called an organic layer) including a light emitting layer between a pair of electrodes, an anode and a cathode, which is characterized in that the light emitting layer contains a phosphorescent material and a compound of formula (I). The OLED may have additional layers, such as a hole injecting layer, a hole transporting layer, an electron injecting layer, an electron transporting layer, a protective layer, and so forth in addition to the light emitting layer. Each of these layers may have functions other than the one meant by the designation of the layer.

It is a preferred embodiment of the OLED of the invention that the compound represented by formula (I) function as a host material. The terminology "host material" as used herein means a material, excepting a light emitting material (i.e., the phosphorescent material in the case of the present invention), which composes the light emitting layer and performs at least one of the following functions.

(a) dispersing and retaining therein a light emitting material (i.e., the phosphorescent material),
(b) receiving holes from the anode, a hole transporting layer, etc.,
(c) receiving electrons from the cathode, an electron transporting layer, etc.,
(d) transporting holes and/or electrons,
(e) supplying a site for allowing holes and electrons to be recombined and to generate excitons,
(f) transferring the energy of the generated excitons to the light emitting material, and
(g) transporting holes and/or electrons to the light emitting material.

The host material preferably has at least one, particularly both, of the function of transporting holes and/or electrons and the function of transferring the energy of excitons generated by hole/electron recombination to the light emitting material.

In a preferred embodiment, the compound of formula (I) forms a major proportion of the light emitting layer. It is particularly preferred for the compound to serve as a host material and form a major proportion of the light emitting layer. The proportion of the compound in the light emitting layer is preferably 50 to 99.9% by weight, still preferably 80 to 99% by weight.

Where the compound of formula (I) functions as a host material, there is a possibility that the compound may be electrochemically oxidized or reduced in performing its function. Accordingly, it is desirable that the compound of formula (I) which functions as a host material be highly stable against electrochemical oxidation and reduction. That is, the compound is preferably such that the oxidized species (e.g., radical cation species) or the reduced species (e.g., radical anion species) is very stable.

Excitons of the host material is generated by hole/electron recombination in a host material. Therefore, it is preferable that the excited state of the host material be stable enough against decomposition or thermal deactivation. This means that the host material should be stable to light, too.

Seeing that thermal destruction of the film or thermal decomposition of the materials is a great cause of deterioration of an OLED, it is preferred that the host material, too, be capable of retaining a stable amorphous film form without undergoing thermal decomposition and crystalization even at high temperatures.

As described above, it is desirable for the compound used as a host material to be extremely stable against light, heat, and electrochemical oxidation/reduction. The OLED containing such a host compound is expected to exhibit markedly improved durability.

Seeking for a light emitting device having a high luminance, a high luminescence efficiency, and excellent durability, the present inventors have found that a phosphorescent OLED comprising a metal complex having a specific structure as a host material fulfills the above expectation.

From the stand point of device durability, the metal complex of the invention preferably has a glass transition temperature (Tg) of 130° to 400° C., desirably 135° to 400° C., more desirably 140° to 400° C., particularly desirably 150° to 400° C., most desirably 160° to 400° C. The Tg can be confirmed by thermoanalyses, such as differential scanning calorimetry and differential thermal analysis, X-ray diffractometry, polarizing microscopic observation, and the like.

The metal species of the metal complexes according to the invention preferably include, but are not limited to, those of periods 2 to 4, desirably Li, Be, Na, Mg, Al, K, Ca, Sc, Ti, V, Cr, Mn, Fe, Co, Ni, Cu, Zn, Ga, and Ge, more desirably Li, Be, Na, Mg, Al, Ti, Fe, Co, Ni, Cu, Zn, and Ga, particularly desirably Be, Mg, Al, Fe, Ni, Cu, and Zn, especially desirably Be, Mg, Al, Ga, Cu, and Zn, most desirably Al, Zn and Ga.

The metal complex may be a polynuclear complex having a plurality of metal ions of the same kind or different kinds per molecule. The metal complex may contain ligands of different kinds. The metal complex is preferably neutral.

At least one of the host materials used in the invention is a compound represented by the formula (I). In the formula (I), $X^{11}$, $X^{12}$, and $X^{13}$ each represent a carbon atom, a nitrogen atom, an oxygen atom or a sulfur atom; $Y^1$ represents a carbon atom, a nitrogen atom, an oxygen atom, a sulfur atom or a phosphorus atom; $Z^1$ represents a nitrogen atom, an oxygen atom, a sulfur atom or a phosphorus atom; $M^1$ represents a metal ion; $L^1$ represents a ligand; $n^1$ represents an integer of 1 or greater; $m^1$ represents an integer of 0 or greater; and the bonds between every adjacent atoms is selected from a single bond, a double bond, a triple bond, and a coordinate bond; with the proviso that a compound in which either one of $Y^1$ and $Z^1$ is a nitrogen atom and the other is an oxygen atom is excluded.

The combination of $(Y^1,Z^1)$ in formula (I) is preferably selected from (N,N), (N,S), (S,N), (O,O), and (S,S). Still preferred combinations are (N,N), (N,S), (S,N), and (O,O). Particularly preferred combinations are (N,N), (N,S), and (S,N).

Where the $(Y^1,Z^1)$ combination is (N,N), it is preferred that either one of the $Y^1$-$M^1$ and the $Z^1$-$M^1$ bonds be a coordinate bond with the other being a covalent bond. Where the $(Y^1,Z^1)$ combination is (N,S) or (S,N), it is preferred that the N-$M^1$ bond be a coordinate bond with the S-M3 bond being a covalent bond.

$X^{11}$ and $X^{13}$ each preferably represent a carbon atom or a nitrogen atom. $X^{12}$ is preferably a carbon atom, a nitrogen atom or an oxygen atom. $Y^1$ is preferably a nitrogen atom, an oxygen atom or a sulfur atom. $Z^1$ is preferably a nitrogen atom, an oxygen atom or a sulfur atom. When one of $Y^1$ and $Z^1$ is a nitrogen atom, the other is not an oxygen atom. Although the bonds between atoms of formula (I) are each depicted by a single solid line, the line does not indicate a single bond. That is, the bonds may be any of a single bond, a double bond, a triple bond, and a coordinate bond. Each atom, if possible, may have a substituent. A bond between two of the atoms may be shared by another ring to form a condensed ring.

The substituents the atoms can have as referred to above include an alkyl group (preferably having 1 to 20 carbon atoms, still preferably 1 to 12 carbon atoms, particularly preferably 1 to 8 carbon atoms, such as methyl, ethyl, isopropyl, t-butyl, n-octyl, n-decyl, n-hexadecyl, cyclopropyl, cyclopentyl or cyclohexyl), an alkenyl group (preferably having 2 to 20 carbon atoms, still preferably 2 to 12 carbon atoms, particularly preferably 2 to 8 carbon atoms, such as vinyl, allyl, 2-butenyl or 3-pentenyl), an alkynyl group (preferably having 2 to 20 carbon atoms, still preferably 2 to 12 carbon atoms, particularly preferably 2 to 8 carbon atoms, such as propargyl or 3-pentynyl), an aryl group (preferably having 6 to 30 carbon atoms, still preferably 6 to 20 carbon atoms, particularly preferably 6 to 12 carbon atoms, such as phenyl, p-methylphenyl or naphthyl), a substituted carbonyl group (preferably having 1 to 20 carbon atoms, still preferably 1 to 16 carbon atoms, particularly preferably 1 to 12 carbon atoms, such as acetyl, benzoyl, methoxycarbonyl, phenyloxycarbonyl, dimethylaminocarbonyl or phenylaminocarbonyl), an amino group (preferably having up to 20 carbon atoms, still preferably 1 to 16 carbon atoms, particularly preferably 1 to 12 carbon atoms, such as dimethylamino, methylcarbonylamino, ethylsulfonylamino, dimethylaminocarbonylamino or phthalimide), a sulfonyl group (preferably having 1 to 20 carbon atoms, still preferably 1 to 16 carbon atoms, particularly preferably 1 to 12 carbon atoms, such as mesyl or tosyl), a sulfo group, a carboxyl group, a heterocyclic group (including an aliphatic one and an aromatic one, preferably having 1 to 50 carbon atoms, still preferably 1 to 30 carbon atoms, particularly preferably 2 to 12 carbon atoms, and containing at least one of oxygen, sulfur, and nitrogen, such as imidazolyl, pyridyl, furyl, piperidyl, morpholino, benzoxazolyl or triazolyl), a hydroxyl group, an alkoxy group (preferably having 1 to 20 carbon atoms, still preferably 1 to 16 carbon atoms, particularly preferably 1 to 12 carbon atoms, such as methoxy or benzyloxy), an aryloxy group (preferably having 6 to 20 carbon atoms, still preferably 6 to 16 carbon atoms, particularly preferably 6 to 12 carbon atoms, such as phenyloxy or naphthyloxy), a halogen atom (preferably fluorine, chlorine, bromine or iodine), a thiol group, an alkylthio group (preferably having 1 to 20 carbon atoms, still preferably 1 to 16 carbon atoms, particularly preferably 1 to 12 carbon atoms, such as methylthio), a an arylthio group (preferably having 6 to 20 carbon atoms, still preferably 6 to 16 carbon atoms, particularly preferably 6 to 12 carbon atoms, such as phenylthio), a cyano group, and a silyl group (preferably having up to 40 carbon atoms, still preferably 3 to 30 carbon atoms, particularly preferably 3 to 18 carbon atoms, such as trimethylsilyl, triphenylsilyl or t-butyldiphenylsilyl). These substituents may be substituted.

The metal ion represented by $M^1$ preferably includes, but is not limited to, ions of metals in the 2nd to 4th periods (long-period form), particularly divalent or trivalent metal ions. Preferred examples are $Be^{2+}$, $Mg^{2+}$, $Al^{3+}$, $Ga^{3+}$, $Zn^{2+}$ and $Cu^{2+}$. $Al^{3+}$, $Ga^{3+}$ and $Zn^{2+}$ are especially preferred.

$L^1$ is a monodentate or polydentate ligand. The ligand includes a halide ion (e.g., $Cl^-$, $Br^-$ or $I^-$), a perchlorate ion, an alkoxy ion (preferably having 1 to 20 carbon atoms, still preferably 1 to 10 carbon atoms, particularly preferably 1 to 5 carbon atoms, such as methoxy ion, ethoxy ion, isopropoxy ion or acetylacetonato), an aryloxy ion (preferably having 6 to 20 carbon atoms, still preferably 6 to 12 carbon atoms, particularly preferably 6 to 8 carbon atoms, such as phenoxy, quinolinol, or 2-(2-hydroxyphenyl)benzazole ion), a nitrogen-containing heterocyclic ligand (preferably having 1 to 20 carbon atoms, still preferably 2 to 10 carbon atoms, particularly preferably 3 to 8 carbon atoms, such as phenanthrene or bipyridyl), an acyloxy ion (preferably having 1 to 20 carbon atoms, still preferably 2 to 10 carbon atoms, particularly preferably 3 to 8 carbon atoms, such as acetoxy), an ether compound ligand (preferably 2 to 20 carbon atoms, still preferably 3 to 10 carbon atoms, particularly preferably 3 to 8 carbon atoms, such as tetrahydrofuran), and a hydroxide ion. Preferred of them are alkoxy ions and aryloxy ions. Aryloxy ions are particularly preferred.

$n^1$ is 1 or a greater integer, and $m^1$ is 0 or a greater integer. While preferred ranges of $n^1$ and $m^1$ depend on the metal ion, $n^1$ is preferably 1 to 4, still preferably 1 to 3, particularly preferably 2 or 3. $m^1$ is preferably 0 to 2, still preferably 0 or 1, particularly preferably 0. $n^1$ and $m^1$ are preferably selected so that the compound of formula (I) may be a neutral complex.

Of the compounds of formula (I) preferred are those represented by formula (II), wherein $X^{21}$ and $X^{22}$ each represent a carbon atom or a nitrogen atom; $Y^2$ represents a carbon atom, a nitrogen atom, an oxygen atom, a sulfur atom or a phosphorus atom; $Z^2$ represents a nitrogen atom, an oxygen atom, a sulfur atom or a phosphorus atom; $Q^{21}$ represents anatomic group necessary to form a 5- to 7-membered ring; $Q^{22}$ represents an atomic group necessary to form a 5- to 7-membered ring; $M^2$ represents a metal ion; $L^2$ represents a ligand; $n^2$ represents an integer of 1 or greater; $m^2$ represents an integer of 0 or greater; and the bond between every adjacent atoms is selected from a single bond, a double bond, a triple bond, and a coordinate bond; with the proviso that a compound in which either one of $Y^2$ and $Z^2$ is a nitrogen atom and the other is an oxygen atom is excluded.

$Y^2$ is preferably a carbon atom, an oxygen atom or a sulfur atom. $Z^2$ is preferably a nitrogen atom, an oxygen atom or a sulfur atom. Where $Z^2$ is a nitrogen atom, it may have a substituent including an alkyl group (preferably having 1 to 20 carbon atoms, still preferably 1 to 12 carbon atoms, particularly preferably 1 to 8 carbon atoms, such as methyl, ethyl, isopropyl, t-butyl, n-octyl, n-decyl, n-hexadecyl, cyclopropyl, cyclopentyl or cyclohexyl), an alkenyl group (preferably having 2 to 20 carbon atoms, still preferably 2 to 12 carbon atoms, particularly preferably 2 to 8 carbon atoms, such as vinyl, allyl, 2-butenyl or 3-pentenyl), an alkynyl group (preferably having 2 to 20 carbon atoms, still preferably 2 to 12 carbon atoms, particularly preferably 2 to 8 carbon atoms, such as propargyl or 3-pentynyl), an aryl group (preferably having 6 to 30 carbon atoms, still preferably 6 to 20 carbon atoms, particularly preferably 6 to 12 carbon atoms, such as phenyl, p-methylphenyl or naphthyl), a substituted carbonyl group (preferably having 1 to 40 carbon atoms, still preferably 1 to 20 carbon atoms, particularly preferably 1 to 12 carbon atoms, such as acetyl, benzoyl, methoxycarbonyl, dimethylaminocarbonyl or phenylaminocarbonyl), a substituted sulfonyl group (preferably having 1 to 20 carbon atoms, still preferably 1 to 16 carbon atoms, particularly preferably 1 to 12 carbon atoms, such as mesyl or tosyl), and a heterocyclic group (preferably having 1 to 20 carbon atoms, still preferably 1 to 16 carbon atoms, particularly preferably 1 to 12 carbon atoms, and containing at least one of oxygen, sulfur, and nitrogen, such as imidazolyl, pyridyl, furyl or piperidyl). These substituents may further be substituted. Preferred of these substituents on the nitrogen atom are an alkyl group, an aryl group, and an aromatic heterocyclic group. An alkyl group and an aryl group are still preferred.

In formula (II), when one of $Y^2$ and $Z^2$ is a nitrogen atom, the other is not an oxygen atom. Although the bonds between atoms of formula (II) are each depicted by a single solid line, the line does not indicate a single bond. That is, the bonds may be any of a single bond, a double bond, a triple bond, and a coordinate bond.

The 5- to 7-membered ring formed by $Q^{21}$ includes a benzene ring, a naphthalene ring, a pyridine ring, a pyrimidine ring, a pyridazine ring, a pyrazine ring, a quinoline ring, a quinoxaline ring, an isoquinoline ring, a cinnoline ring, a phthalazine ring, aquinazoline ring, triazine ring, an acridine ring, a phenazine ring, a phenanthroline ring, a naphthyridine ring, a phenanthridine ring, a pyrrole ring, an indole ring, a pyrazole ring, an imidazole ring, a benzimidazole ring, an oxazole ring, a benzoxazole ring, a thiazole ring, a benzothiazole ring, a selenazole ring, a benzoselenazole ring, an indazole ring, an isothiazole ring, an isoxazole ring, a triazole ring, a benzotriazole ring, a tetrazole ring, an oxadiazole ring, a thiadiazole ring, a thiatriazole ring, an azaindole ring, an imidazopyridine ring, a purine ring, an imidazoline ring, azepine ring, a furan ring, a benzofuran ring, a thiophene ring, a benzothiophene ring, and the recited rings with their aromatic ring(s) fully or partially reduced. The ring formed by $Q^{21}$ is preferably an aromatic ring. Suitable aromatic rings include a pyridine ring, a pyrimidine ring, a pyrazine ring, a quinoline ring, a quinoxaline ring, an isoquinoline ring, a phthalazine ring, a pyrrole ring, an indole ring, an imidazole ring, a benzimidazole ring, an oxazole ring, a benzoxazole ring, a thiazole ring, a benzothiazole ring, a triazole ring, a benzotriazole ring, and an imidazopyridine ring. An imidazopyridine ring is the most preferred.

The 5-, 6- or 7-membered ring formed by $Q^{22}$ includes a benzene ring, a naphthalene ring, a pyridine ring, a pyrimidine ring, a pyridazine ring, a pyrazine ring, a quinoline ring, a quinoxaline ring, an isoquinoline ring, a cinnoline ring, a phthalazine ring, a quinazoline ring, triazine ring, an acridine ring, a phenazine ring, a phenanthroline ring, a naphthyridine ring, a phenanthridine ring, a pyrrole ring, an indole ring, a pyrazole ring, an imidazole ring, a benzimidazole ring, an oxazole ring, a benzoxazole ring, a thiazole ring, a benzothiazole ring, a selenazole ring, a benzoselenazole ring, an indazole ring, an isothiazole ring, an isoxazole ring, a triazole ring, a benzotriazole ring, a tetrazole ring, an oxadiazole ring, a thiadiazole ring, a thiatriazole ring, an azaindole ring, an imidazopyridine ring, a purine ring, an imidazoline ring, azepine ring, a furan ring, a benzofuran ring, a thiophene ring, a benzothiophene ring, a cyclohexane ring, a cyclohexene ring, a pyrene ring, and a perylene ring. The ring formed by $Q^{22}$ is preferably an aromatic ring. Suitable aromatic rings include a benzene ring, a naphthalene ring, a pyridine ring, a thiophene ring, and a pyrazine ring, with a benzene ring and a pyridine ring being still preferred. Abenzene ring is the most preferred. The ring formed by $Q^{21}$ or $Q^{22}$ may have a substituent, which can be selected from those recited above as substituents on the atoms in formula (I).

$M^2$, $L^2$, $n^2$, and $m^2$ have the same meanings as $M^1$, $L^1$, $n^1$, and $m^1$, respectively. Preferred ranges of the former are the same as for the latter.

Of the compounds represented by formula (I), compounds represented by formula (III) are also preferred. In formula (III), $R^{31}$, $R^{32}$, and $R^{33}$ each represent a hydrogen atom or a substituent; $Y^3$ represents a carbon atoms, a nitrogen atom, an oxygen atom, a sulfur atom or a phosphorus atom; $Z^3$ represents a nitrogen atom, an oxygen atom, a sulfur atom or a phosphorus atom; $M^3$ represents a metal ion; $L^3$ represents a ligand; $n^3$ represents an integer of 1 or greater; $m^3$ represents an integer of 0 or greater; the bond between $Y^3$ and $M^3$ and the bond between $Z^3$ and $M^3$ are each a covalent bond or a coordinate bond; with the proviso that a compound in which either one of $Y^3$ and $Z^3$ is a nitrogen atom and the other is an oxygen atom is excluded.

$Y^3$ is preferably an oxygen atom, a sulfur atom or a nitrogen atom, more preferably an oxygen atom or a nitrogen atom. When $Y^3$ is a nitrogen atom, the nitrogen atom may have a substituent selected from, for example, those recited above as substituents $Z^2$ in formula (II) can have. $Z^3$ is preferably an oxygen atom, a sulfur atom or a nitrogen atom. When $Z^3$ is a nitrogen atom, the nitrogen atom may have a substituent selected from, for example, those recited above as substituents $Z^2$ in formula (II) can have.

When either one of $Y^3$ and $Z^3$ is a nitrogen atom, the other is not an oxygen atom. Although the bonds between $Y^3$ and $M^3$ and between $Z^3$ and $M^3$ in formula (III) are each depicted by a single solid line, the line does not indicate a covalent bond. That is, these bonds may be a covalent bond or a coordinate bond.

The substituents represented by $R^{31}$, $R^{32}$ or $R^{33}$ include those enumerated above as substituents of the atoms in formula (I). $R^{31}$, $R^{32}$, and $R^{33}$ may be bonded to each other to form a ring. $R^{31}$, $R^{32}$, and $R^{33}$ are each preferably an alkyl group, an aryl group or a heterocyclic group.

$M^3$, $L^3$, $n^3$, and $m^3$ have the same meaning as $M^1$, $L^1$, $n^1$, and $m^1$ in formula (I), respectively. Preferred ranges of the latter also apply to the former.

Specific but non-limiting examples of the compounds represented by formula (I) are shown below.

H-1
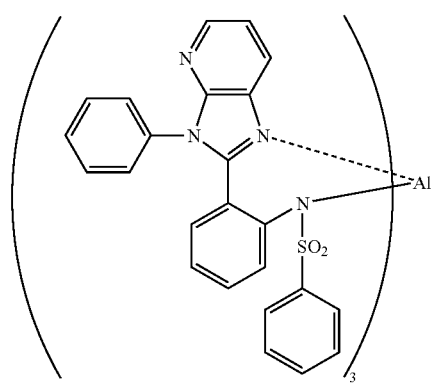
H-2
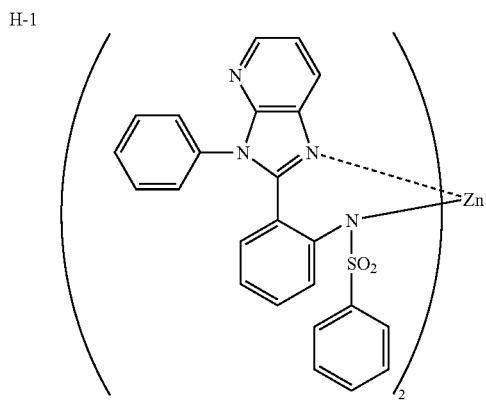
H-3
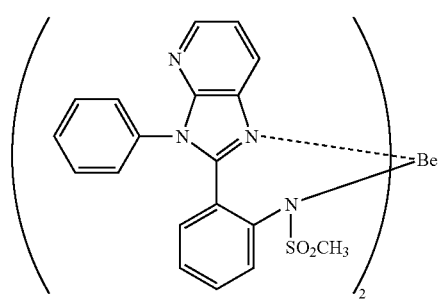
H-4
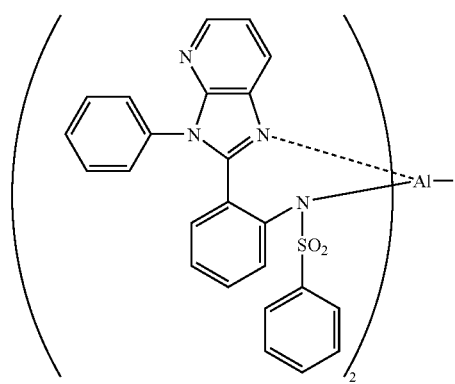
H-5
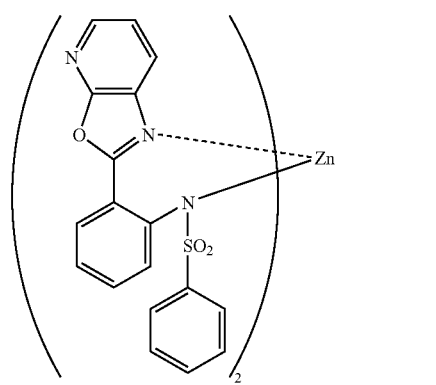
H-6
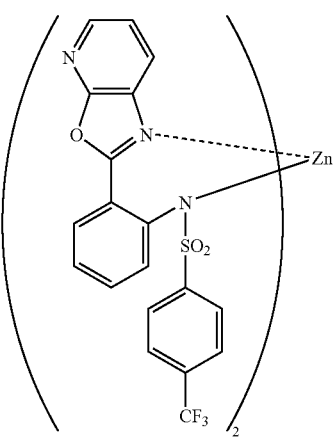

-continued
H-7
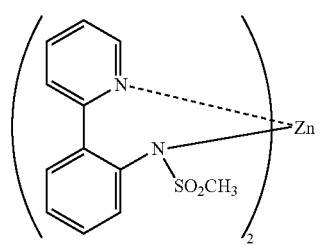
H-8
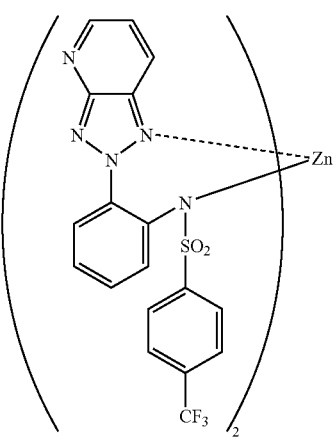
H-9
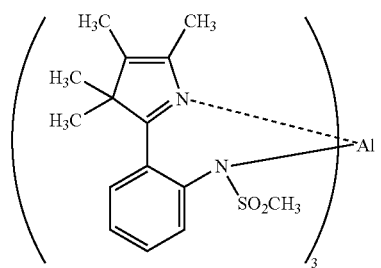
H-10
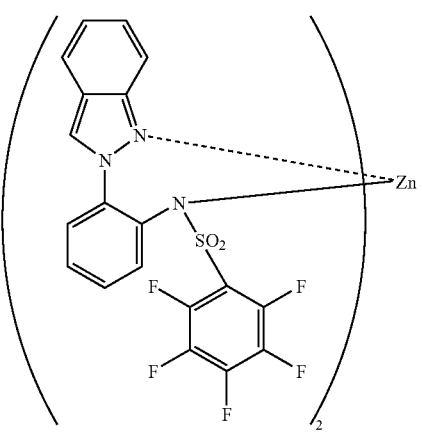
H-11
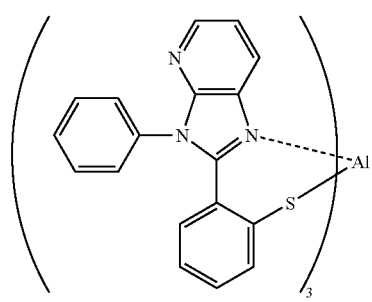
H-12
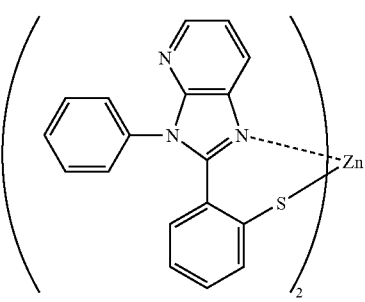
H-13
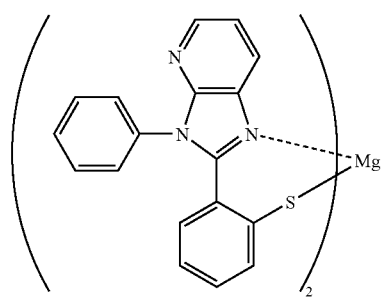

-continued
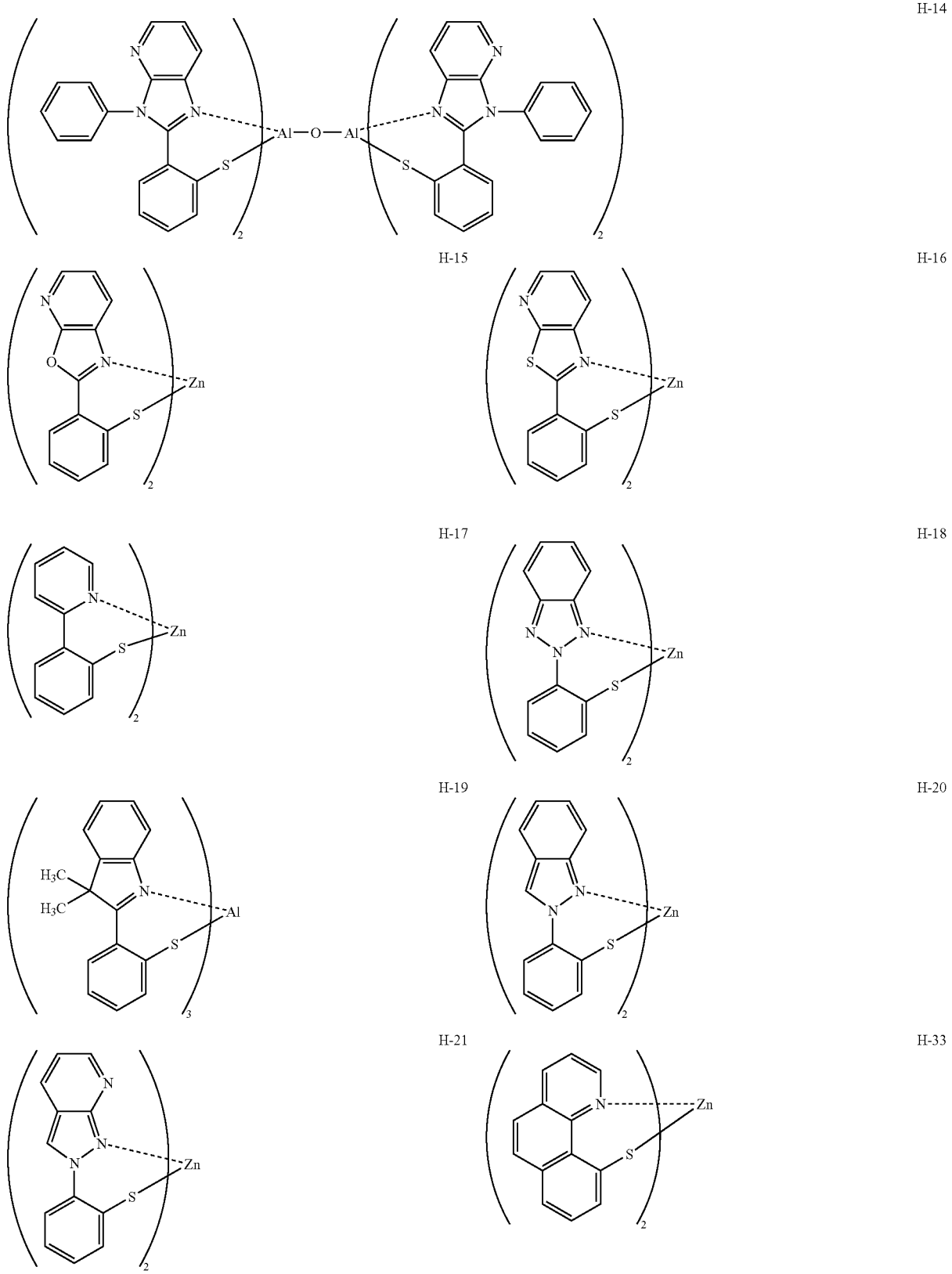

-continued
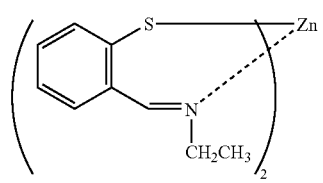 H-34
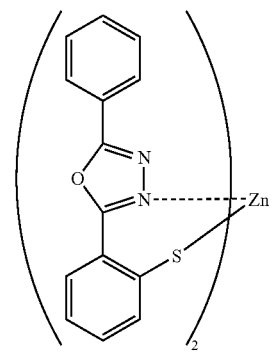 H-35
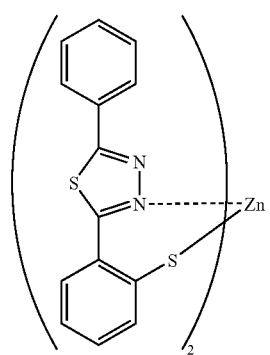 H-36
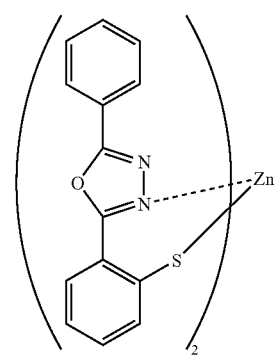 H-37
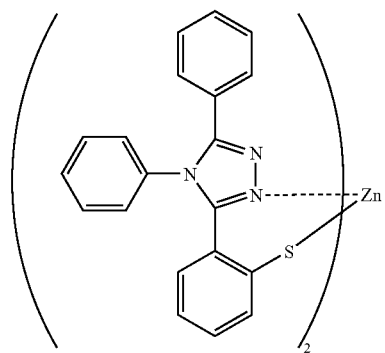 H-38
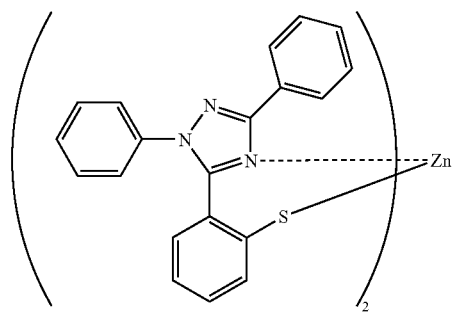 H-40
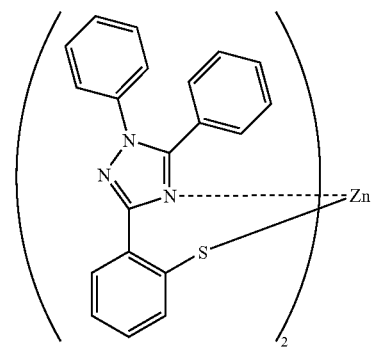 H-41

-continued
H-42
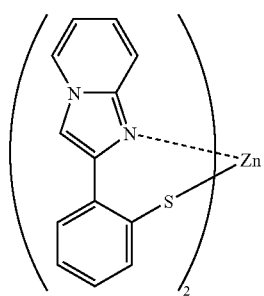
H-43
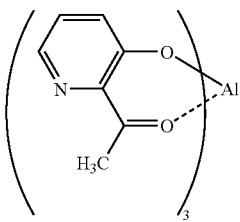
H-44
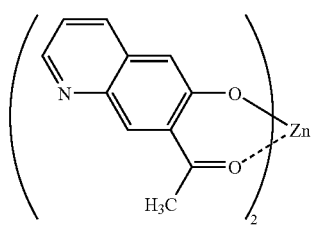
H-45
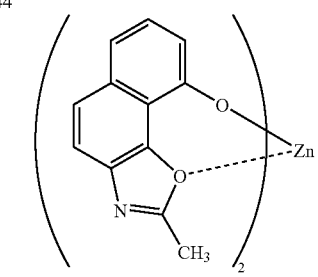
H-46
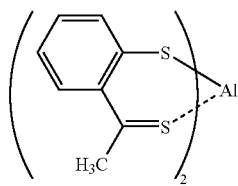
H-47
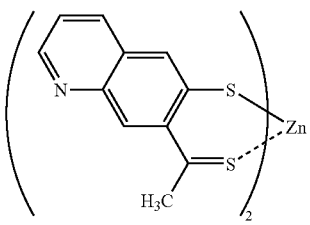
H-48
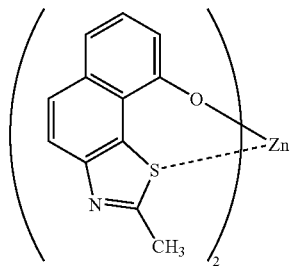
H-49
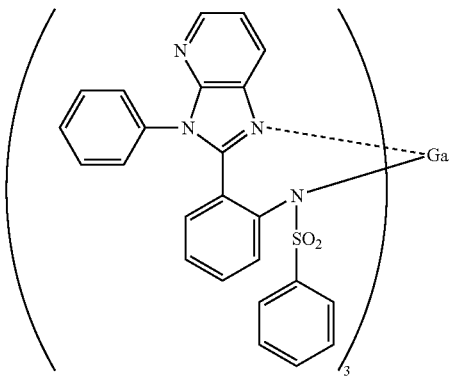
H-50
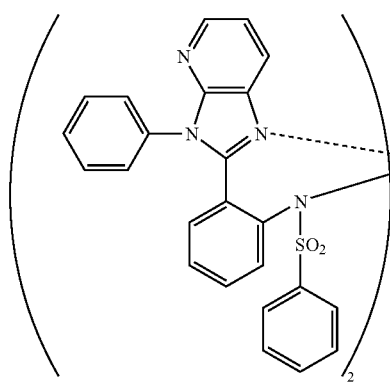
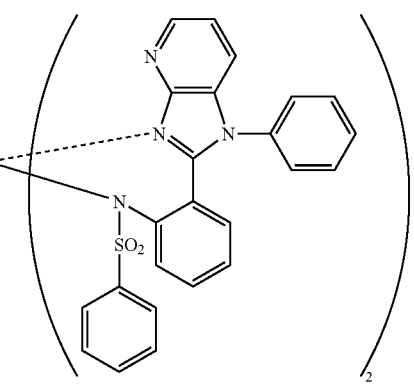

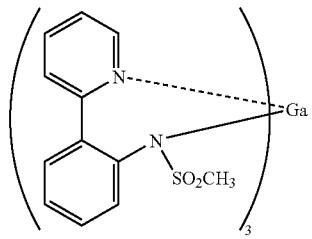

H-51

The EL device of the invention substantially utilizes light emission from a phosphorescent material, i.e., light emission from the triplet excited state of the material. The term "substantially" means that 80% or more of light emission obtained from the device is light emission from the triplet excited state (phosphorescence), and preferably, 90% or more of light emission obtained from the device is phosphorescence. The term "phosphorescent material" as used herein is defined to be a material which emits phosphorescence. The OLED of the present invention contains at least one phosphorescent material, which preferably includes, but is not limited to, transition metal complexes.

The center metal of the transition metal complexes preferably includes, but is not limited to, iridium, platinum, rhenium, and ruthenium. Iridium and platinum are still preferred. Iridium is particularly preferred. Of transition metal complexes ortho-metalated complexes are much preferred. "Ortho-metalated complex" is a generic term given to the compounds described, e.g., in Yamamoto Akio, *Yukikinzokukagaku-kiso to ohyo*, Shokabo Publishing Co., 1982, p150 and 232 and H. Yersin, *Photochemistry and Photophysics of Coordination Compounds*, Springer-Verlag, 1987, pp. 71-77 and 135-146.

The phosphorescent materials can be used either individually or as a combination of two or more thereof. The compounds represented by formula (I) are also used either individually or as a mixture of two or more thereof. The light emitting layer may contain, in addition to the phosphorescent material and the compound of formula (I), other components for optimizing the luminescence performance of the device, such as compounds having a charge injecting function and/or a charge transporting function. The light emitting layer is preferably made solely of the phosphorescent material and the compound of formula (I) nevertheless.

The weight ratio of the compound of formula (I) to the total weight of the compound of formula (I) and the phosphorescent material in the light emitting layer is preferably 50% or more, still preferably 50 to 99.99%, particularly preferably 70 to 99.9%, especially 80 to 99%. Where components other than the phosphorescent material and the compound of formula (I) are incorporated into the light emitting layer, the content of the compound of formula (I) is decreased accordingly to make up 100% in total.

The phosphorescent material preferably has a phosphorescence quantum yield of 70% or higher, still preferably 80% or higher, particularly preferably 85% or higher, at 20° C.

The phosphorescence life time of the phosphorescent compound to be used is not particularly limited but is preferably 1 ms or shorter, still preferably 100 μs or shorter, particularly preferably 10 μs or shorter, at room temperature.

Phosphorescent materials which can be suitably used in the invention are described, e.g., in U.S. Pat. No. 6,303,231 B1, U.S. Pat. No. 6,097,147, WO 00/57676, WO 00/70655, WO 01/08230, WO 01/39234 A2, WO 01/41512 A1, WO 02/02714, WO 02/15645 A1, JP-A-2001-247859, Japanese Patent Application Nos. 2000-33561, 2001-189539, 2001-248165, 2001-33684, 2001-239281, and 2001-219909, EP 1211257, JP-A-2002-226495, JP-A-2002-234894, JP-A-2001-247859, JP-A-2001-298470, JP-A-2002-173674, JP-A-2002-203678, JP-A-2002-203679, *Nature*, vol. 395, 151 (1998), *Applied Physics Letters*, vol. 75, 4 (1999), *Polymer Preprints*, vol. 41, 770 (2000), *Journal of American Chemical Society*, vol. 123, 4304 (2001), and *Applied Physics Letters*, vol. 79, 2082 (1999).

The OLED according to the present invention is not limited by system configuration, driving mode, pixel formation, use, and so forth.

The elements constituting the OLED of the invention will be described in detail. The OLED has at least one organic layer (i.e., organic compound layer) including the light emitting layer between a pair of electrodes, i.e., an anode and a cathode.

Methods for forming an organic compound layer including the light emitting layer include, but are not limited to, vacuum deposition by resistance heating or electron beam, electrophotography, sputtering, molecular accumulation, wet coating (spray coating, dip coating, impregnation, roll coating, gravure coating, reverse coating, roll brush coating, air knife coating, curtain coating, spin coating, flow coating, bar coating, microgravure coating, air doctor coating, blade coating, squeegee coating, transfer roll coating, kiss coating, casting, extrusion coating, wire bar coating, screen coating, etc.), ink jet method, printing, and transfer. From the standpoint of film characteristics, ease of production, and cost, resistance heating vacuum deposition, wet coating, and transfer are preferred. Where the OLED has two or more organic layers, two or more of these methods can be used in combination to form the organic layers.

Where wet coating techniques are adopted, it is possible to apply a resin component as dissolved or dispersed in a solvent together with the effective component. Applicable resin components include polyvinyl chloride, polycarbonate, polystyrene, polymethyl methacrylate, polyester, polysulfone, polyphenylene oxide, polybutadiene, poly(N-vinylcarbazole), hydrocarbon resins, ketone resins, phenoxy resins, polyamide, ethyl cellulose, polyvinyl acetate, ABS resins, polyurethane, melamine resins, unsaturated polyester resins, alkyd resins, epoxy resins, and silicone resins.

The solvent which can be used in wet coating is preferably capable of uniformly dissolving or dispersing the phosphorescent material and the compound of formula (I). It is preferred that the light emitting layer to have the phosphorescent material and the compound of formula (I) in a uniformly dispersed state.

The OLED may have a hole injecting layer, a hole transporting layer, an electron injecting layer, an electron transporting layer, a protective layer, and so forth in addition to the light emitting layer. Each of the additional layers may have functions other than the intended one meant by the designation of the layer.

Any materials can be used to form the hole injecting layer and the hole transporting layer as long as the resulting layer performs at least one of a function of injecting holes supplied by the anode, a function of transporting holes, and a function of blocking the electrons injected from the cathode. Examples of such materials include carbazole, imidazole, triazole, oxazole, oxadiazole, polyarylalkanes, pyrazoline, pyrazolone, phenylenediamine, arylamines, amino-substituted chalcones, styrylanthracene, fluorenone, hydrazone, stilbene, silazane, aromatic tertiary amine compounds, styrylamine compounds, aromatic dimethylidyne compounds, porphyrin compounds, polysilane compounds, poly(N-vinylcarbazole), aniline copolymers; conductive oligomers or polymers, such as thiophene oligomers and polythiophene; organic metal complexes, transition metal complexes; and derivatives of the recited compounds.

The thickness of the hole injecting layer and the hole transporting layer is not particularly limited and usually ranges from 1 nm to 5 μm, preferably 5 nm to 1 μm, still preferably 10 to 500 nm. The hole injecting layer and the hole transporting layer may each have a single layer structure made of one or more of the above-recited materials or a multilayer structure composed of two or more layers having the same or different compositions.

Any materials can be used to make up the electron injecting layer and the electron transporting layer as long as the resulting layer performs at least one of a function of injecting electrons from the cathode, a function of transporting the electrons, and a function of blocking holes from the anode. Such materials include triazole, triazine, oxazole, oxadiazole, fluorenone, anthraquinodimethane, anthrone, diphenylquinone, thiopyran dioxide, carbodiimide, fluorenylidenemethane, distyrylpyrazine, silole derivatives, aromatic (e.g., naphthalene or perylene) tetracarboxylic acid anhydrides, phthalocyanine, various metal complexes, such as metal complexes of 8-quinolinol derivatives, metallophthalocyanines, and metal complexes having benzoxazole or benzothiazole as a ligand, and derivatives of the recited compounds.

The thickness of the electron injecting layer and the electron transporting layer is not particularly limited and usually ranges from 1 nm to 5 μm, preferably 5 nm to 1 μm, still preferably 10 to 500 nm. The electron injecting layer and the electron transporting layer may each have a single layer structure made of one or more of the above-recited materials or a multilayer structure composed of two or more layers having the same or different compositions.

The light emitting layer essentially contains at least one phosphorescent material and at least one metal complex of formula (I). The light emitting layer may contain additional compounds, such as benzoxazole, benzimidazole, benzothiazole, styrylbenzene, polyphenyl, diphenylbutadiene, tetraphenylbutadiene, naphthylimide, coumarin, perylene, perinone, oxadiazole, aldazine, pyrralidine, cyclopentadiene, bisstyrylanthracene, quinacridone, pyrrolopyridine, thiadiazolopyridine, styrylamine, aromatic dimethylidyne compounds; polymers, such as polythiophene, polyphenylene, and polyphenylene vinylene; and derivatives of these compounds. Nevertheless, it is preferred that the light emitting layer be made solely of the phosphorescent material and the compound of formula (I).

The light emitting layer may have either a single layer structure or a multilayer structure. In the latter case, the layers composing the light emitting layer may emit light of the same or different colors. Each of the layers is preferably composed solely of the phosphorescent material and the compound of formula (I). The thickness of the light emitting layer is not particularly limited and usually ranges from 1 nm to 5 μm, preferably 5 nm to 1 μm, still preferably 10 to 500 nm.

The light emitting layer may have a plurality of domain structures. The light emitting layer may have other domain structures. The diameter of each domain is preferably 0.2 to 10 nm, still preferably 0.3 to 5 nm, particularly preferably 0.5 to 3 nm, especially preferably 0.7 to 2 nm.

The protective layer can be of any material that prevents substances which may accelerate deterioration of the device, such as moisture and oxygen, from entering the device. Such materials include metals, e.g., In, Sn, Pb, Au, Cu, Ag, Al, Ti, and Ni; metal oxides, e.g., MgO, SiO, $SiO_2$, $Al_2O_3$, GeO, NiO, CaO, BaO, $Fe_2O_3$, $Y_2O_3$, and $TiO_2$; metal fluorides, e.g., $MgF_2$, LiF, $AlF_3$, and $CaF_2$; polyethylene, polypropylene, polymethylmethacrylate, polyimide, polyurea, polytetrafluoroethylene, polychlorotrifluoroethylene, polydichlorodifluoroethylene, chlorotrifluoroethylene-dichlorodifluoroethylene copolymers, tetrafluoroethylene copolymers, fluorine-containing copolymers having a cyclic structure in the main chain thereof; water absorbing substances having a water absorption of at least 1%; and moisture-proof substances having a water absorption of 0.1% or less.

Methods for forming the protective layer include, but are not limited to, vacuum evaporation, sputtering, reactive sputtering, molecular beam epitaxy, cluster ion beam-assisted deposition, ion plating, plasma polymerization (radiofrequency-excited ion plating), plasma-enhanced CVD, laser-assisted CVD, thermal CVD, gas source CVD, wet coating techniques, printing, ink jet printing, transfer, and electrophotography.

The anode supplies holes to organic compound layers, such as a hole injecting layer, a hole transporting layer, and a light emitting layer. Materials making up the anode include metals, alloys, metal oxides, electrically conductive compounds, and mixtures thereof. Those having a work function of 4 eV or higher are preferred. Examples of useful materials are electrically conductive metal oxides, such as tin oxide, zinc oxide, indium oxide, and indium tin oxide (ITO); metals, such as gold, silver, chromium, and nickel; mixtures or laminates of these metals and conductive metal oxides; inorganic electrically conductive substances, such as copper iodide and copper sulfide; organic electrically conductive substances, such as polyaniline, polythiophene, and polypyrrole; and mixtures or laminates of these materials and ITO. Conductive metal oxides are preferred. ITO is especially preferred for its productivity, electrical conductivity, and transparency. The thickness of the anode is decided appropriately according to the material and usually ranges from 10 nm to 5 μm, preferably 50 nm to 1 μm, still preferably 100 to 500 nm.

The anode is usually used as formed on a substrate, such as a soda lime glass plate, an alkali-free glass plate or a transparent resin plate. When a glass substrate is chosen, alkali-free glass is preferred for avoiding leaching of ions from glass. In using soda lime glass, one having a barrier coat of silica, etc. is preferred. The thickness of the substrate is not particularly limited as long as the device can maintain mechanical strength. A glass substrate, for example, usually has a thickness of 0.2 mm or larger, preferably 0.7 mm or larger.

The anode is formed by an appropriate technique selected according to the material. For instance, an ITO layer is formed by electron beam deposition, sputtering, resistance heating vacuum deposition, ion plating, chemical reaction (e.g., a sol-gel process), spraying, dipping, thermal CVD, plasma-enhanced CVD, coating with an ITO dispersion, and the like.

The anode thus formed may be subjected to cleaning or a like treatment for reducing the driving voltage or increasing luminescence efficiency. For an ITO anode, for instance, a UV-ozone treatment or a plasma treatment is effective.

The cathode supplies electrons to the organic layers such as an electron injecting layer, an electron transporting layer, and a light emitting layer. The material making up the cathode is selected taking into consideration adhesion to an adjacent layer, such as an electron injecting layer, an electron transporting layer or a light emitting layer, ionization potential, stability, and the like. Useful materials include metals, alloys, metal halides, metal oxides, electrically conductive compounds, and mixtures thereof. Examples of useful materials are alkali metals (e.g., Li, Na, and K) and fluorides thereof, alkaline earth metals (e.g., Mg and Ca) and fluorides thereof, gold, silver, lead, aluminum, sodium-potassium alloys or mixtures, lithium-aluminum alloys or mixtures, magnesium-silver alloys or mixtures, and rare earth metals (e.g., indium and ytterbium). Preferred of them are those having a work function of 4 eV or less, particularly aluminum, lithium-aluminum alloys or mixtures, and magnesium-silver alloys or mixtures. The thickness of the cathode is selected appropriately according to the material and usually ranges from 10 nm to 5 μm, preferably 50 nm to 1 μm, still preferably 100 nm to 1 μm.

The cathode can be formed by electron beam deposition, sputtering, resistance heating vacuum deposition, wet coating, transfer, and the like. In vacuum deposition, a single metal may be deposited, or two or more components may be deposited simultaneously. A plurality of metals may be deposited simultaneously to form an alloy cathode, or a previously formulated alloy may be deposited.

The anode and the cathode each preferably have as low sheet resistance as possible, particularly a sheet resistance lower than several hundreds of ohms per square.

It is preferred that the at least one organic layer of the OLED according to the invention have a three-layer structure composed of a hole transporting layer, a light emitting layer, and an electron transporting layer or a four-layer structure additionally comprising a hole blocking layer.

The light-extraction efficiency of the OLED according to the present invention can be improved by various known techniques, such as surface structuring of the substrate (for example, formation of a fine uneven pattern), controlling the refractive index of the substrate, ITO layer or organic layer(s), and controlling the thickness of the substrate, ITO layer or organic layer (s). The improvement in light-extraction efficiency leads to an increase in external quantum efficiency.

The substrate which can be used in the OLED includes, but is not limited to, inorganic materials, such as yttrium-stabilized zirconia and glass; polyesters, such as polyethylene terephthalate, polybutylene terephthalate, and polyethylene naphthalate; and polymers, such as polyethylene, polycarbonate, polyether sulfone, polyarylate, allyl diglycol carbonate, polyimide, polycycloolefins, norbornene resins, poly(chlorotrifluoroethylene), Teflon, and tetrafluoroethylene-ethylene copolymers.

The OLED of the invention maybe of a so-called top emission type, in which light is emitted from the anode side of the device.

The OLED of the invention is suited for use in the fields of display devices, displays, backlights, light sources for electrophotography, illumination, recording, exposure or reading, signs or signboards, interior decorations, optical communications, and so forth.

EXAMPLES

The present invention will now be illustrated in greater detail with reference to Examples, but it should be understood that the present invention is not deemed to be limited thereto.

Comparative Example 1

N,N'-Diphenyl-N,N'-di(m-tolyl)benzidine (TPD) was vacuum deposited on a cleaned ITO substrate to a deposit thickness of 50 nm. Alq and Ir(ppy)$_3$ were vacuum co-deposited on the TPD layer at a weight ratio of 17:1 to a thickness of 36 nm, and compound a shown below was deposited thereon to a thickness of 36 nm. A pattern mask (having a pattern giving a light-emitting area of 4 mm by 5 mm) was put on the thus formed organic thin film, and lithium fluoride was vacuum deposited to a thickness of 3 nm, and aluminum was then vacuum deposited to a thickness of 60 nm to complete an OLED.

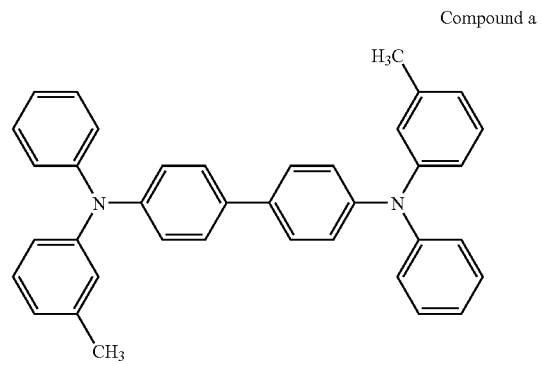

Compound a

TPD

-continued

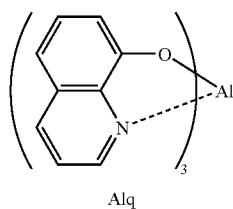

Alq

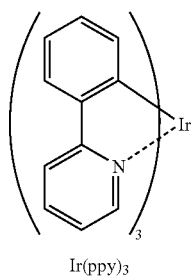

Ir(ppy)₃

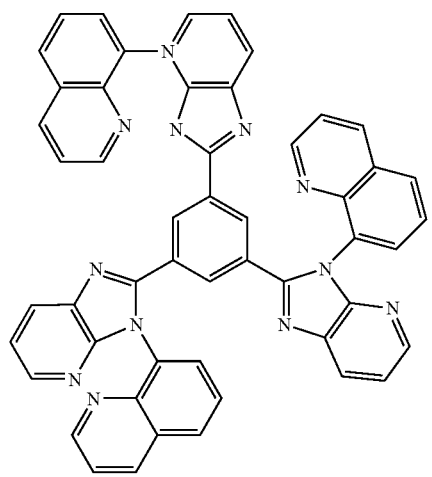

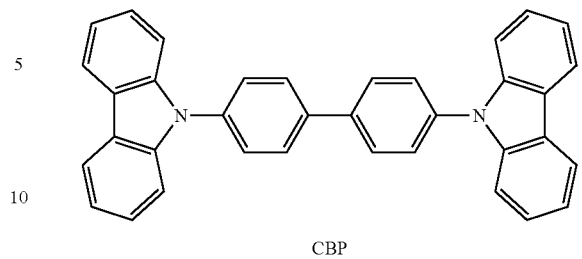

CBP

On applying a constant DC voltage to the resulting OLED by use of Source-Measure Unit Model 2400 supplied by Toyo Corp., green light emission was obtained. The green luminescence had CIE chromaticity coordinates of (x,y)= (0.324, 0.557) as measured with Spectral Analyzer PMA-11 supplied by Hamamatsu Photonics K. K., an $EL_{max}$ of 530 nm, a maximum luminance of 1300 cd/m² as measured with a luminance meter BM-8 supplied by Topcon, and an external quantum efficiency of 0.22%.

Comparative Example 2

An OLED was prepared in the same manner as in Comparative Example 1, except for replacing Alq with CBP shown below. The resulting OLED was evaluated in the same manner as in Comparative Example 1. As a result, green light emission was obtained. The green luminescence had CIE chromaticity coordinates of (x,y)=(0.276, 0.630), an $EL_{max}$ of 516 nm, a maximum luminance of 27000 cd/m², and an external quantum efficiency of 12.7%.

Comparative Example 3

An OLED was prepared in the same manner as in Comparative Example 1, except for replacing Alq with compound H-4 shown below (a compound disclosed in JP-A-2002-305085). The resulting OLED was evaluated in the same manner as in Comparative Example 1. As a result, green light emission was obtained. The green luminescence had CIE chromaticity coordinates of (x,y)=(0.286, 0.624), an $EL_{max}$ of 522 nm, a maximum luminance of 21000 cd/m², and an external quantum efficiency of 11.4%.

Compound H-4 (JP-A-2002-305083):

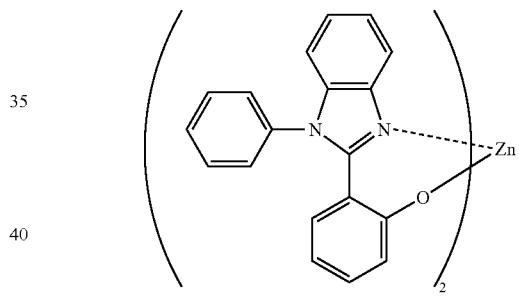

Example 1

An OLED was prepared in the same manner as in Comparative Example 1, except for replacing Alq with compound H-2 of the present invention. The resulting OLED was evaluated in the same manner as in Comparative Example 1. As a result, green light emission was obtained. The green luminescence had CIE chromaticity coordinates of (x,y)=(0.320, 0.610), an $EL_{max}$ of 520 nm, a maximum luminance of 73000 cd/M², and an external quantum efficiency of 17.4%.

It is seen from the results of Example 1 in comparison with those of Comparative Examples 1 to 3 that an OLED comprising the metal complex of the present invention as a host material exhibits higher luminance and higher luminescence efficiency than conventional OLEDs.

The half decay time of a given initial luminance of the device prepared in Comparative Example 2 was 8 hours, while that of the device prepared in Example 1 was 45 hours. As can be seen from this comparison, an OLED comprising the metal complex of the present invention as a host material is superior in driving durability as well.

This application is based on Japanese Patent application JP 2002-382455, filed Dec. 27, 2002, the entire content of which is hereby incorporated by reference, the same as if set forth at length.

What is claimed is:

1. An organic electroluminescent device comprising:
a pair of electrodes; and
at least one organic compound layer between the pair of electrodes, the at least one organic compound layer including a light emitting layer,
wherein the light emitting layer contains a phosphorescent material and a compound represented by the formula (I):

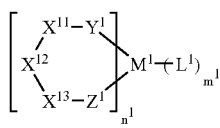

wherein $X^{11}$, $X^{12}$, and $X^{13}$ each independently represent a carbon atom, a nitrogen atom, an oxygen atom or a sulfur atom; $Y^1$ represents a nitrogen atom; $Z^1$ represents a nitrogen atom; $M^1$ represents an ion of metal selected from the group consisting of metals in the 2nd to 4th periods of the Periodic Table of Elements; $L^1$ represents a ligand; $n^1$ represents an integer of 1 or greater; $m^1$ represents an integer of 0 or greater; and the bond between every pair of adjacent atoms is selected from the group consisting of a single bond, a double bond, a triple bond, and a coordinate bond.

2. The organic electroluminescent device of claim 1, wherein the light emitting layer contains the compound of the formula (I) as a host material.

3. The organic electroluminescent device of claim 1, wherein the light emitting layer contains 50 to 99.9% by weight of the compound of the formula (I), and the phosphorescent material substantially emits light.

4. The organic electroluminescent device of claim 1, wherein the light emitting layer contains 50 to 99.9% by weight of the compound of the formula (I).

5. The organic electroluminescent device of claim 1, wherein the light emitting layer contains 80 to 99% by weight of the compound of the formula (I).

6. An organic electroluminescent device comprising:
a pair of electrodes; and
at least one organic compound layer between the pair of electrodes, the at least one organic compound layer including a light emitting layer,
wherein the light emitting layer contains a phosphorescent material and a compound represented by the formula (II):

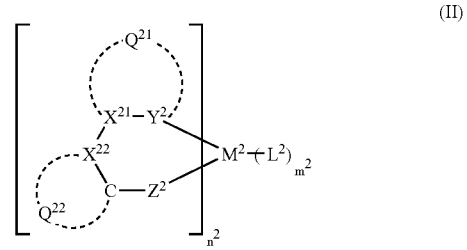

wherein $X^{21}$ and $X^{22}$ each independently represent a carbon atom or a nitrogen atom; $Y^2$ represents a nitrogen atom; $Z^2$ represents a nitrogen atom; $Q^{21}$ represents an atomic group necessary to form a 5- to 7-membered ring; $Q^{22}$ represents an atomic group necessary to form a 5- to 7-membered ring; $M^2$ represents an ion of metal selected from the group consisting of metals in the 2nd to 4th periods of the Periodic Table of Elements; $L^2$ represents a ligand; $n^2$ represents an integer of 1 or greater; $m^2$ represents an integer of 0 or greater; and the bond between every pair of adjacent atoms is selected from the group consisting of a single bond, a double bond, a triple bond, and a coordinate bond.

7. An organic electroluminescent device comprising:
a pair of electrodes; and
at least one organic compound layer between the pair of electrodes, the at least one organic compound layer including a light emitting layer,
wherein the light emitting layer contains a phosphorescent material and a compound represented by the formula (III):

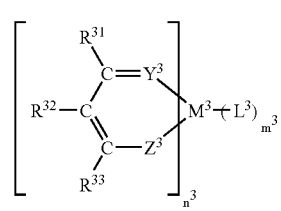

wherein $R^{31}$, $R^{32}$, and $R^{33}$ each independently represent a hydrogen atom or a substituent; $Y^3$ represents a carbon atom, a nitrogen atom, an oxygen atom, a sulfur atom or a phosphorus atom; $Z^3$ represents a nitrogen atom, an oxygen atom, a sulfur atom or a phosphorus atom; $M^3$ represents an ion of metal selected from the group consisting of Li, Be, Na, Mg, Al, K, Ca, Sc, Ti, V, Cr, Zn, Ga, and Ge; $L^3$ represents a ligand; $n^3$ represents an integer of 1 or greater; $m^3$ represents an integer of 0 or greater; the bond between $Y^3$ and $M^3$ and the bond between $Z^3$ and $M^3$ are each a covalent bond or a coordinate bond; with the proviso that a compound in which either one of $Y^3$ and $Z^3$ is a nitrogen atom and the other is an oxygen atom is excluded.

8. The organic electroluminescent device of claim 1, wherein the light emitting layer contains at least two host materials.

9. The organic electroluminescent device of claim 1, wherein the metal ion of $M^1$ is one selected from divalent or trivalent metal ions of metals in 2nd to 4th periods of a periodic table.

10. The organic electroluminescent device of claim 1, wherein the metal ion of $M^1$ is $Be^{2+}$, $Mg^{2+}$, $Al^{3+}$, $Ga^{3+}$, $Zn^{2+}$ or $Cu^{2+}$.

11. The organic electroluminescent device of claim 1, wherein the metal ion of $M^1$ is $Al^{3+}$, $Ga^{3+}$ or $Zn^{2+}$.

12. The organic electroluminescent device of claim 1, wherein the ligand of $L^1$ is a halide ion, a perchlorate ion, an alkoxy ion, an aryloxy ion, a nitrogen-containing heterocyclic ligand, an acyloxy ion, an ether compound ligand, or a hydroxide ion, and $m^1$ is an integer of 1 or greater.

13. The organic electroluminescent device of claim 1, wherein the ligand of $L^1$ is an alkoxy ion or an aryloxy ion, and $m^1$ is an integer of 1 or greater.

14. The organic electroluminescent device of claim 1, wherein the ligand of $L^1$ is an aryloxy ion, and $m^1$ is an integer of 1 or greater.

15. An organic electroluminescent device comprising:
a pair of electrodes; and
at least one organic compound layer between the pair of electrodes, the at least one organic compound layer including a light emitting layer,
wherein the light emitting layer contains a phosphorescent material and a compound represented by the formula (II):

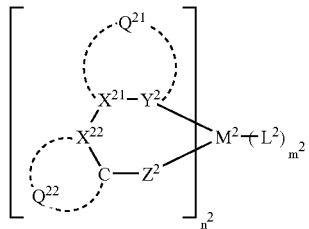

(II)

wherein $X^{21}$ and $X^{22}$ each independently represent a carbon atom or a nitrogen atom; $Y^2$ represents a carbon atom, a nitrogen atom, an oxygen atom, a sulfur atom or a phosphorus atom; $Z^2$ represents a nitrogen atom, an oxygen atom, a sulfur atom or a phosphorus atom; $Q^{21}$ represents an atomic group necessary to form a ring which can be substituted; $Q^{22}$ represents an atomic group necessary to form a 5- to 7-membered ring; $M^2$ represents an ion of metal selected from the group consisting of metals in the 2nd to 4th periods of the Periodic Table of Elements; $L^2$ represents a ligand; $n^2$ represents an integer of 1 or greater; $m^2$ represents an integer of 0 or greater; and the bond between every pair of adjacent atoms is selected from the group consisting of a single bond, a double bond, a triple bond, and a coordinate bond; with proviso that a compound in which either one of $Y^2$ and $Z^2$ is a nitrogen atom and the other is an oxygen atom is excluded, wherein the ring formed by $Q^{21}$ is a benzene ring, a naphthalene ring, a pyridine ring, a pyrimidine ring, a pyridazine ring, a pyrazine ring, a quinoline ring, a quinoxaline ring, an isoquinoline ring, a cinnoline ring, a phthalazine ring, a quinazoline ring, a triazine ring, an acridine ring, a phenazine ring, a phenanthroline ring, a naphthyridine ring, a phenanthridine ring, a pyrrole ring, an indole ring, a pyrazole ring, an imidazole ring, a benzimidazole ring, a selenazole ring, a benzoselenazole ring, an indazole ring, an isothiazole ring, an isoxazole ring, a triazole ring, a benzotriazole ring, a tetrazole ring, an oxadiazole ring, a thiadiazole ring, a thiatriazole ring, an azaindole ring, an imidazopyridine ring, a purine ring, an imidazoline ring, azepine ring, a furan ring, a benzofuran ring, a thiophene ring, or a benzothiophene ring.

16. The organic electroluminescent device of claim 7, wherein $M^3$ represents an ion of metal selected from the group consisting of Al, Zn, and Ga.

* * * * *